(12) United States Patent
Rivkin et al.

(10) Patent No.: US 8,273,670 B1
(45) Date of Patent: *Sep. 25, 2012

(54) LOAD LOCK DESIGN FOR RAPID WAFER HEATING

(75) Inventors: Michael Rivkin, Los Altos, CA (US); Ron Powell, Portola Valley, CA (US); Shawn Hamilton, Boulder Creek, CA (US); Michael Nordin, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/102,858

(22) Filed: May 6, 2011

Related U.S. Application Data

(63) Continuation of application No. 11/608,185, filed on Dec. 7, 2006, now Pat. No. 7,960,297.

(51) Int. Cl.
*H01L 21/00* (2006.01)
*B05B 5/00* (2006.01)

(52) U.S. Cl. ........................................ 438/800; 118/640

(58) Field of Classification Search ................. 438/800
See application file for complete search history.

(56) References Cited

U.S. PATENT DOCUMENTS

| | | | |
|---|---|---|---|
| 3,612,825 A | 10/1971 | Chase et al. |
| 4,457,359 A | 7/1984 | Holden |
| 4,535,835 A | 8/1985 | Holden |
| 4,563,589 A | 1/1986 | Scheffer |
| 4,615,755 A | 10/1986 | Tracy et al. |
| 5,113,929 A | 5/1992 | Nakagawa et al. |
| 5,178,682 A | 1/1993 | Tsukamoto et al. |
| 5,228,208 A | 7/1993 | White et al. |
| 5,282,121 A | 1/1994 | Bornhorst et al. |
| 5,447,431 A | 9/1995 | Muka |
| 5,558,717 A | 9/1996 | Zhao et al. |
| 5,588,827 A | 12/1996 | Muka |
| 5,811,762 A | 9/1998 | Tseng |
| 6,072,163 A | 6/2000 | Armstrong et al. |
| 6,087,632 A | 7/2000 | Mizosaki et al. |
| 6,200,634 B1 | 3/2001 | Johnsgard et al. |
| 6,214,184 B1 | 4/2001 | Chien et al. |
| 6,228,438 B1 | 5/2001 | Schmitt |
| 6,307,184 B1 | 10/2001 | Womack et al. |

(Continued)

FOREIGN PATENT DOCUMENTS

JP 62-229833 10/1987

(Continued)

OTHER PUBLICATIONS

Shrinivasan et al., "Single-Chamber Sequential Curing of Semiconductor Wafers," Novellus Systems, Inc., U.S. Appl. No. 11/115,576, filed Apr. 26, 2005.

(Continued)

*Primary Examiner* — William D Coleman
(74) *Attorney, Agent, or Firm* — Weaver Austin Villeneuve & Sampson LLP

(57) ABSTRACT

A semiconductor processing tool heats wafers using radiant heat and resistive heat in chamber or in a load lock where pressure changes. The wafers are heated in greater part with a resistive heat source until a transition temperature or pressure is reached, then they are heated in greater part with a radiant heat source. Throughput improves for the tool because of the wafers can reach a high temperature uniformly in seconds.

18 Claims, 7 Drawing Sheets

U.S. PATENT DOCUMENTS

| | | | |
|---|---|---|---|
| 6,320,736 | B1 | 11/2001 | Shamouilian et al. |
| 6,394,797 | B1 | 5/2002 | Sugaya et al. |
| 6,413,321 | B1 | 7/2002 | Kim et al. |
| 6,467,491 | B1 | 10/2002 | Sugiura et al. |
| 6,559,424 | B2 | 5/2003 | O'Carroll et al. |
| 6,563,092 | B1 | 5/2003 | Shrinivasan et al. |
| 6,639,189 | B2 | 10/2003 | Ramanan et al. |
| 6,860,965 | B1 | 3/2005 | Stevens |
| 6,895,179 | B2 | 5/2005 | Kanno et al. |
| 6,899,765 | B2 | 5/2005 | Krivts et al. |
| 7,105,463 | B2 | 9/2006 | Kurita et al. |
| 7,138,606 | B2 | 11/2006 | Kanno et al. |
| 7,253,125 | B1 | 8/2007 | Bandyopadhyay et al. |
| 7,265,061 | B1 | 9/2007 | Cho et al. |
| 7,327,948 | B1 | 2/2008 | Shrinivasan et al. |
| 7,410,355 | B2 | 8/2008 | Granneman et al. |
| 7,576,303 | B2 | 8/2009 | Natsuhara et al. |
| 7,665,951 | B2 | 2/2010 | Kurita et al. |
| 7,845,891 | B2 | 12/2010 | Lee et al. |
| 7,941,039 | B1 | 5/2011 | Shrinivasan et al. |
| 7,960,297 | B1 * | 6/2011 | Rivkin et al. ................ 438/800 |
| 7,981,763 | B1 | 7/2011 | Van Schravendijk et al. |
| 8,033,771 | B1 | 10/2011 | Gage et al. |
| 8,052,419 | B1 | 11/2011 | Nordin et al. |
| 2002/0117109 | A1 | 8/2002 | Hazelton et al. |
| 2002/0162630 | A1 | 11/2002 | Satoh et al. |
| 2003/0013280 | A1 | 1/2003 | Yamanaka |
| 2003/0113187 | A1 | 6/2003 | Lei et al. |
| 2004/0023513 | A1 | 2/2004 | Aoyama et al. |
| 2004/0060917 | A1 | 4/2004 | Liu et al. |
| 2004/0183226 | A1 | 9/2004 | Newell et al. |
| 2004/0187790 | A1 | 9/2004 | Bader et al. |
| 2005/0006230 | A1 * | 1/2005 | Narushima et al. ........ 204/298.2 |
| 2005/0045616 | A1 | 3/2005 | Ishihara |
| 2005/0226793 | A1 | 10/2005 | Sakakura et al. |
| 2005/0258164 | A1 | 11/2005 | Hiramatsu et al. |
| 2006/0018639 | A1 | 1/2006 | Ramamurthy et al. |
| 2006/0075960 | A1 | 4/2006 | Borgini et al. |
| 2006/0081186 | A1 | 4/2006 | Shinriki et al. |
| 2007/0029046 | A1 | 2/2007 | Li et al. |
| 2007/0107845 | A1 | 5/2007 | Ishizawa et al. |
| 2007/0205788 | A1 | 9/2007 | Natsuhara et al. |
| 2007/0243057 | A1 | 10/2007 | Shimada et al. |
| 2008/0102644 | A1 | 5/2008 | Goto et al. |
| 2008/0134820 | A1 | 6/2008 | Bjorck et al. |
| 2009/0060480 | A1 | 3/2009 | Herchen |
| 2009/0142167 | A1 | 6/2009 | Gage et al. |
| 2009/0277472 | A1 | 11/2009 | Rivkin et al. |
| 2010/0270004 | A1 | 10/2010 | Landess et al. |
| 2011/0318142 | A1 | 12/2011 | Gage et al. |

FOREIGN PATENT DOCUMENTS

| | | |
|---|---|---|
| JP | 01-107519 | 4/1989 |
| JP | 06/037054 | 2/1994 |
| JP | 07-090582 | 4/1995 |
| JP | 07/147274 | 6/1995 |
| JP | 08-316215 | 11/1996 |
| JP | 09-092615 | 4/1997 |
| JP | 2000-286243 | 10/2000 |
| JP | 2002-246375 | 8/2002 |
| JP | 2005/116655 | 4/2005 |
| KR | 2003/0096732 | 12/2003 |
| WO | 02/11911 | 2/2002 |

OTHER PUBLICATIONS

U.S. Office Action mailed Oct. 3, 2007, from U.S. Appl. No. 11/115,576.

U.S. Final Office Action mailed May 2, 2008, from U.S. Appl. No. 11/115,576.

U.S. Office Action mailed Oct. 17, 2008, from U.S. Appl. No. 11/115,576.

Doble et al., "Concave Pedestal for Uniform Heating of Silicon Wafers," Novellus Systems, Inc., U.S. Appl. No. 11/546,189, filed Oct. 10, 2006.

U.S. Office Action mailed Jun. 16, 2008, from U.S. Appl. No. 11/546,189.

U.S.Final Office Action mailed Oct. 16, 2008, from U.S. Appl. No. 11/546,189.

U.S. Office Action mailed Jul. 18, 2006, from U.S. Appl. No. 11/184,101.

Notice of Allowance and Fee Due mailed Jan. 25, 2007, from U.S. Appl. No. 11/184,101.

Nordin et al., "Closed Loop Temperature Heat Up and Control Utilizing Wafer-To-Heater Pedestal Gap Modulation," Novellus Systems, Inc., U.S. Appl. No. 11/937,364, filed Nov. 8, 2007.

Gage et al., "Transferring Heat in Loadlocks," Novellus Systems, Inc., U.S. Appl. No. 12/140,196, filed Jun. 16, 2008.

Rivkin et al., "Photoresist Stripping Method and Apparatus," Novellus Systems, Inc., U.S. Appl. No. 61/050,880, filed May 6, 2008.

U.S. Appl. No. 11/937,364, Office Action mailed Apr. 9, 2010.

U.S. Appl. 11/115,576, Office Action mailed Apr. 22, 2009.

U.S. Appl. No. 11/115,576, Office Action mailed Apr. 15, 2010.

U.S. Appl. No. 11/129,266, "Tailored profile pedestal for thermoelastically stable cooling for heating of substrates", Landess et al., filed May 12, 2005.

U.S. Appl. No. 11/129,266, Office Action mailed Feb. 20, 2009.

U.S. Appl. No. 11/129,266, Office Action mailed Oct. 28, 2009.

U.S. Appl. No. 11/608,185, Office Action mailed Apr. 26, 2010.

U.S. Appl. No. 11/751,584, "Cast pedestal with heating element on coaxial heat exchanger", Shrinivasan et al., filed May 21, 2007.

U.S. Appl. No. 11/851,310, Office Action mailed Jun. 8, 2010.

U.S. Appl. No. 61/122,308, "Conductively cooled process for wide temperature range processes", Nieh et al., filed Dec. 12, 2008.

U.S. Appl. No. 12/333,239, "Minimum contact area wafer clamping with gas flow for rapid wafer cooling", Gage et al., filed Dec. 11, 2008.

International Search Report and Written Opinion for application No. PCT/US2009/067040, mailed Aug. 2, 2010.

U.S. Appl. No. 11/608,185, Office Action mailed Nov. 26, 2010.

U.S. Appl. No. 12/333,239, Final Office Action mailed Dec. 27, 2010.

Notice of Allowance for U.S. Appl. No. 11/851,310, mailed Jan. 5, 2011.

U.S. Appl. No. 11/937,364, Office Action mailed Dec. 27, 2010.

U.S. Appl. No. 12/333,239, Office Action mailed Mar. 9, 2011.

U.S. Appl. No. 12/333,239, Notice of Allowance mailed Jun. 27, 2011.

U.S. Appl. No. 12/333,239, Allowed Claims, Jun. 27, 2011.

Notice of Allowance for U.S. Appl. No. 11/608,185, mailed Mar. 22, 2011.

U.S. Appl. No. 13/086,010, "High Temperature Pedestal Overlay for Stable & Uniform Heat Transfer", Angelov et al., filed Apr. 13, 2011.

U.S. Appl. No. 13/227,160, "Minimum contact area wafer clamping with gas flow for rapid wafer cooling", Gage et al., filed Sep. 7, 2011.

U.S. Appl. No. 11/937,364, Notice of Allowance mailed Sep. 19, 2011.

Allowed Claims for U.S. Appl. No. 11/937,364, as of Sep. 19, 2011.

U.S. Appl. No. 13/276,202, "Closed Loop Temperature Heat Up and Control Utilizing Wafer-To-Heater Pedestal Gap Modulation," Nordin et al., filed Oct. 18, 2011.

U.S. Appl. No. 12/435,890, Office Action mailed Dec. 28, 2011.

U.S. Appl. No. 12/140,196, Office Action mailed Jan. 4, 2012.

U.S. Appl. No. 12/749,170, Office Action mailed Feb. 6, 2012.

* cited by examiner

LOAD LOCK DESIGN FOR RAPID WAFER HEATING

CROSS REFERENCE TO RELATED APPLICATION

This application is a continuation of prior application Ser. No. 11/608,185 filed on Dec. 7, 2006, now pending, the disclosure of which is incorporated by reference herein in its entirety.

FIELD OF THE INVENTION

The present invention relates generally to semiconductor device fabrication, and more particularly to semiconductor wafer processing systems. Even more specifically, it relates to methods and apparatus for heating a wafer.

BACKGROUND OF THE INVENTION

A typical semiconductor wafer processing system has a process chamber for processing semiconductor wafers and wafer handling modules for moving the wafers in and out of the process chamber. Process chambers are available for chemical vapor deposition, physical vapor deposition, etching, electro-plating/electro-fill, plasma, thermal and radiation treatments, and other semiconductor device fabrication processes. For example, a chemical vapor deposition chamber may be used to deposit a film of dielectric material on a wafer.

Wafer handling modules employ manipulators, such as robots, for transporting wafers between two locations of a wafer processing system. A wafer placed in a loading station is picked-up by a robot and typically goes through a load lock before reaching the process chamber where the wafer is processed.

A load lock is often used to change the pressure from atmospheric at the loading station to the pressure required in process chambers (generally a reduced pressure). An atmospheric wafer handler removes a wafer from the load station and places it into the load lock through a port, valve, or door. After the arm of the wafer handler (usually called an "end effector") exits, the load lock is isolated by closing the port, valve, or door. The small volume of the single-wafer load lock allows for fast pump down and vent cycles. The load lock is usually pumped down to the pressure of the next module, usually a process chamber or a transfer chamber. Then another port, valve, or door opens to equilibrate the pressure between the next module and the load lock, and the wafer passes through to the next module. Therefore, a wafer may transfer from atmospheric conditions to very low pressure conditions in a few seconds, while avoiding having to vent and pump down a larger volume process chamber or transfer chamber.

Load locks play a critical role in preventing contamination on the wafer. When the wafers are loaded to and unloaded from processing chambers during operation, residual particles are stirred and circulated as the processing chamber is pumped and/or vented to establish operating pressures or to restore loading pressures. Particles that can contaminate a wafer may be generated by the chemical or physical processes in the process chamber, scraping of wafer handling components, or chemical incompatibilities of the different materials. Wafers stay in the load lock until the processing chamber pressure is established. Because the load lock pressure and the pressure of the next module are controlled to be the same, when the wafer transfers, a minimum amount of pressure equalization takes place, so that residual particles are not stirred and contaminate the wafer. Additionally, load locks are not equipped with in situ cleaning capability. Technicians must normally perform any cleaning laboriously by dismantling the parts and cleaning them by hand. Because of the need to avoid contamination and difficulty to clean, no particle generating activity is normally performed in the load lock.

A load lock may also be equipped with a wafer heating or cooling unit and sometimes both. By providing a cooling unit within the load lock, system throughput can be increased by eliminating the need to move a newly processed wafer to a separate cooling station before moving the wafer to the load lock. System throughput for applications where the wafer needs to be heated before entering the process chamber can also be increased by providing a heating unit within the load lock. This eliminates the need for an intermediate pre-heating operation and station.

Load lock wafer heating has been accomplished with a heated pedestal. The heat is transmitted by gas conduction and radiation through a small gap between the wafer and the pedestal. But this wafer heating is inefficient because the pedestal has to be maintained at a much higher temperature than the desired wafer temperature. Maintaining a high pedestal temperature limits the types of materials that may be used and the life of the pedestal. Further, having such a high temperature object in close proximity to the wafer interferes with wafer temperature measurement for temperature control.

This technique of heating a wafer in a load lock is also slow. The heating time required to reach a steady-state temperature may be longer than the processing time in a process station, making the load lock pre-heat the throughput limiting process step, reducing tool throughput for some applications. An alternative is to remove a wafer before a steady-state temperature is reached, but because wafer temperature cannot be accurately measured, the downstream semiconductor process may be affected adversely if the wafer is too hot or too cold or if the temperature is not uniform across the wafer.

Improvements to this process and associated apparatus would be desirable.

SUMMARY

The present invention provides a wafer heating process and apparatus for uniform and rapid heating in a changing pressure environment, such as a load lock. In accordance with the invention, a semiconductor processing tool heats wafers in a load lock using a radiant heat source and a resistive heat source. The wafers are heated in greater part with a resistive heat source until a transition temperature or pressure is reached, then they are heated in greater part with a radiant heat source. Throughput improves for the tool because the wafers can uniformly reach a high temperature in seconds.

One aspect of the invention pertains to a semiconductor processing apparatus that comprises a load lock. The load lock comprises a load lock housing, a radiant heat source, a substrate support having a resistive heat source, and a vacuum source coupled to the load lock housing. The resistive and radiant heat sources are operable to heat a wafer on the substrate support to a desired temperature. The radiant heat source may be infrared lamps. The substrate support may also have a mechanism for holding the substrate in place, which may be an electrostatic chuck or clamps. The load lock may also include gas injection ports and a pyrometer to measure wafer temperature.

Another aspect of the invention involves methods of heating a semiconductor substrate in a load lock. The method comprises providing a wafer on a substrate support in a load lock, heating the wafer with a resistive heat source, and heating the wafer with a radiant heat source. The resistive heat source heats the wafer in greater part until about 250-600° C., preferably about 250° C.; then the radiant heat source heats the wafer in greater part until the desired temperature set point. The wafer temperature should not exceed the set point by more than 5° C., preferably 1° C. The method may also include the steps of providing a gas at a pressure of greater than about 10 torr, to a gap between the substrate support and the wafer. The gas may be an inert gas, such as helium, nitrogen, argon, or a combination thereof. The method may also include the step of electrostatically holding the wafer to the substrate support within a gap of 10-2000 microns. In some embodiments, the step of electrostatically holding the wafer only occurs in the very last stages of wafer heating, such as when the wafer heating is more than 80% complete.

Another aspect of the invention involves a method of heating a wafer in a chamber. The method comprises providing a wafer on a substrate support, heating the wafer with a resistive heat source, reducing the pressure in the chamber, heating the wafer with a radiant heat source, and removing the wafer from the chamber. The resistive heat source heats the wafer in greater part until the pressure in the chamber is reduced to about 1-100 torr, preferably about 10 torr. The radiant heat source heats the wafer in greater part after the pressure in the chamber is reduced to about 1-100 torr, preferably about 10 torr, and until a desired temperature set point is reached. The chamber may be a load lock.

Yet another aspect of the invention involves a method of heating a wafer in a chamber. The method comprises providing a wafer on a substrate support, heating the wafer with a resistive heat source, heating the wafer with a radiant heat source, reducing the radiant heat when the wafer reaches a temperature set point, and removing the wafer from the chamber. Before the wafer is removed from the chamber, the wafer is allowed to thermally equilibrate with the substrate support such that the wafer temperature becomes uniform. The chamber may be a load lock. This method may also include steps of reducing pressure in the chamber and then filling it with an appropriate conductive gas at a set reduced pressure.

These and other features and advantages of the invention will be described in more detail below with reference to the associated drawings.

DETAILED DESCRIPTION OF A PREFERRED EMBODIMENT

Figure 1:
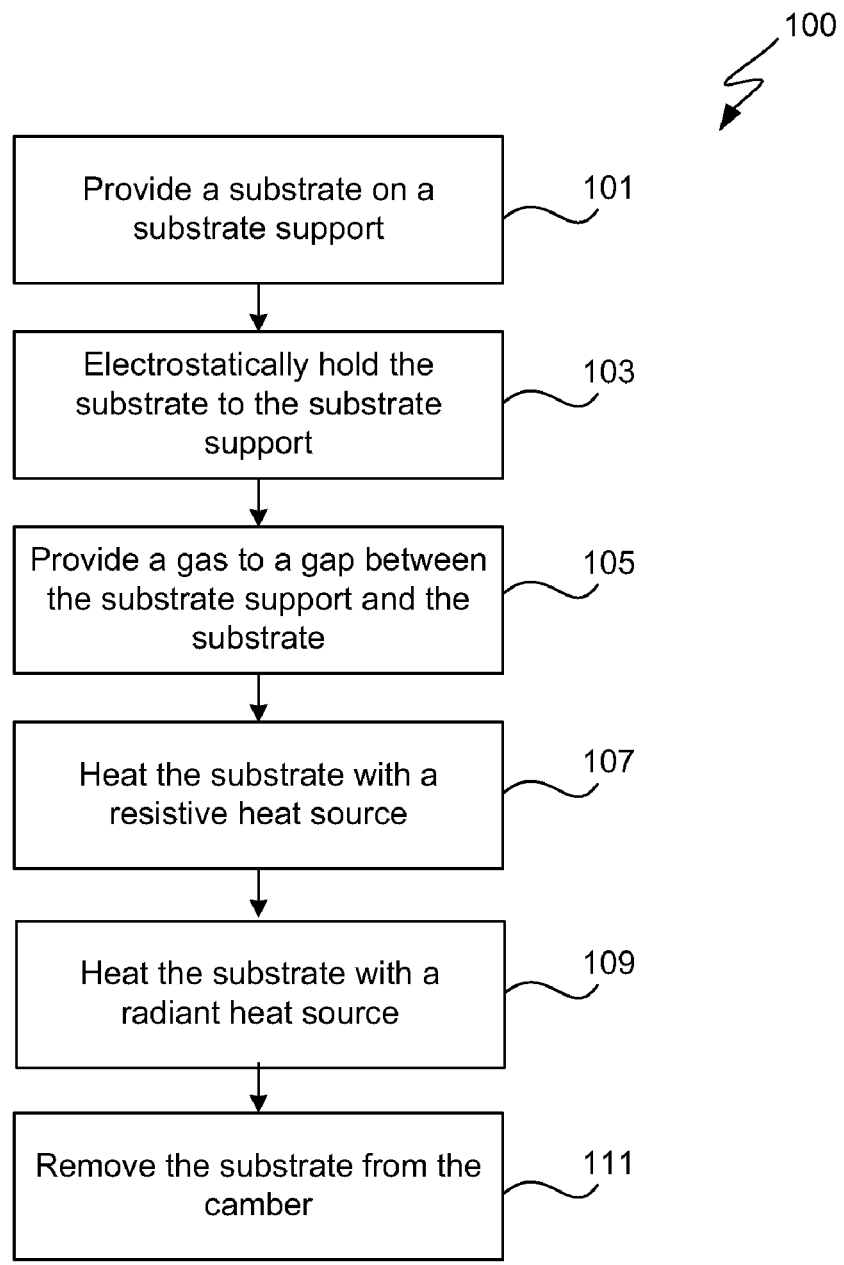
FIG. 1 is a flow chart of a wafer heating method in accordance with the present invention.

In the following detailed description of the present invention, a number of specific embodiments are set forth in order to provide a thorough understanding of the invention. However, as will be apparent to those skilled in the art, the present invention may be practiced without these specific details or by using alternate elements or processes. In some descriptions herein, well-known processes, procedures, and components have not been described in detail so as not to unnecessarily obscure aspects of the present invention.

In this application, the terms "wafer" and "substrate" and terms "substrate support" and "pedestal" will be used interchangeably. The following detailed description assumes the invention is implemented on a wafer. However, the invention is not so limited. The work piece may be of various shapes, sizes, and materials. In addition to semiconductor wafers, other work pieces that may take advantage of this invention include various articles such as display backplanes, printed circuit boards and the like.

Introduction

In integrated circuit fabrication, wafer uniformity is a critical issue because it affects the yield and the manufacturing costs. For optimal within wafer uniformity, the process conditions must be the same everywhere across the surface of the wafer. In addition to within wafer uniformity, wafer to wafer uniformity is also important. For optimal wafer to wafer uniformity, successive wafers must experience the same process conditions. If the process conditions differ, the resulting film properties will also differ. The film properties within wafer and from wafer to wafer must be within a certain range for subsequent process steps and ultimately for the integrated circuit to function properly.

Most properties of a deposited film are highly dependent on the deposition temperature. Therefore, it is desirable to keep the wafer temperature uniform across the wafer during deposition and to process each wafer at the same temperature. In a semiconductor process where reactants react chemically to form a film on the surface of the wafer, the wafer is heated to a high temperature prior to deposition. This heating is achieved by placing the wafers on top of flat pedestal heaters kept at a constant temperature, for example about 300-600° C. The rate of wafer heating is determined by radiative and conductive heat exchange between the wafer, pedestal and other parts of a chamber in which the deposition is conducted, such as the walls and showerheads.

Wafer heating, when needed, is typically performed prior to a semiconductor process in a process chamber or station. As the wafer is placed on the substrate support and before any processing takes place, the wafer is usually heated to a desired temperature by a resistive heater and, optionally, a plasma. However, heating the wafer at each chamber or station before processing uses up valuable processing time. In some instances, a dedicated wafer heating chamber or station is used. While the other chambers and stations run deposition processes, the dedicated chamber or station heats the wafer. The throughput is improved in some instances because the heating step in each chamber or station is eliminated, allowing more wafers to be processed. Of course, the film that would have been deposited in the dedicated chamber or station has to be deposited by the remaining chamber or stations. The throughput gain depends on the duration of process, thickness of film to be deposited, and the number of types of processes on the tool. In some instances, a dedicated chamber or station may not be available to heat the wafer.

The load lock may also be used to heat the wafer. Using the load lock to heat the wafer frees up the otherwise dedicated chamber or station to run a semiconductor process, and the tool becomes more flexible in its ability to run different kinds of processes. Because a load lock is used to stage the pressure from atmospheric to the pressure required for the process, the wafer heating must be performed in a changing pressure environment. Even if the process chamber pressure is at one atmosphere, the load lock is usually pumped down to remove the ambient gases ($O_2$ and $N_2$) and any contaminants and repressurized using a purge gas suitable for the process to be performed in the process chamber.

This invention involves using a combination of a radiant heat source and a resistive heat source to heat a wafer. The combination of heat sources enables the wafer to heat up quickly and uniformly by taking advantage of the benefits of both heat sources while avoiding the limitations.

Radiant Heat Source

Radiant heat sources are available in a wide range of wavelengths from x-rays through ultraviolet and visible light to the near infrared and the far infrared. Different kinds of lamps are available, which output a range of wavelengths or a part of the spectrum. Benefits of using lamps are many. Some available lamps may be low cost. Lamps may be turned on and off quickly, such as when a wafer temperature set point is reached. Lamps may be controlled variably by adjusting the power supplied. Lamps may have very high power capable of very rapid wafer heating. The energy flux from lamps does not depend strongly on the wafer temperature or wafer shape.

On the other hand, a wafer, which is made up of mostly silicon, does not efficiently absorb radiation at all wavelengths and temperatures. For example, undoped or lightly doped silicon wafers do not absorb infrared radiation efficiently until the wafer temperature is above about 250-500° C. At ambient temperatures, silicon is effectively transparent to the infrared wavelengths. As the silicon wafer heats up, more and more electrons are excited from the valence band to the conduction band, where they can absorb at infrared wavelengths by a mechanism known as free-carrier absorption. As the wafer absorbs the radiation the temperature increases, and even more electrons are excited from the valence to the conduction band, making it even easier for the wafer to absorb infrared radiation. Therefore at high temperatures, infrared radiation can increase wafer temperature very quickly. The low cost of infrared lamps (such as coarse halogen type lamps) and their ease of operation and control make infrared radiation a cost-effective way to quickly increase wafer temperature at high temperatures.

Other radiant heat sources may be used to heat wafers. Ultraviolet radiation has the advantage that its absorption is not so dependent on wafer temperature, because of its shorter wavelength and higher energy. However, ultraviolet lamps are more expensive and, because of the higher energy, may cause reactions on the wafer surface or change film properties in addition to heating. As a radiant heat source, an ultraviolet lamp would be limited to certain types of films. However, in appropriate circumstances, ultraviolet radiation may be a very good choice.

Uniform temperature is difficult to achieve with a radiant heat source. Lamps radiate in all directions, but a wafer is flat. In order to achieve highly uniform wafer temperature, a sophisticated multi-zone control algorithm with multiple temperature measurements is required. Such algorithms are expensive to implement. Moreover, good radiation uniformity requires well-engineered optics that increases costs.

Wafer to wafer uniformity is also difficult to achieve with a radiant heat source. Wafer doping affects the radiation absorption; therefore, some wafers will heat more rapidly than others. The use of a control loop using temperature feedback is required for good wafer to wafer temperature uniformity. But accurate wafer temperature measurements are difficult to obtain. A radiation pyrometer measures wafer temperature remotely by detecting the radiation the wafer emits, and calculating the temperature using a known emissivity of the wafer. But not all wafers have the same emissivity. Emissivity variations preclude universal temperature measurement. Further, radiation pyrometers tend to develop a feedback starting at about 250-300° C., especially for an infrared pyrometer focusing on a wafer and pedestal reflecting infrared radiation.

Pedestal Heaters

Heating with a substrate support, or pedestal, is most efficient at temperatures below 250° C. A pedestal is a large mass as compared to the wafer and is usually kept at a constant temperature. At low wafer temperatures, the temperature gradient between the wafer and the pedestal is high. Therefore, the heat transfer at low wafer temperatures is also high. As the wafer temperature increases, the temperature gradient reduces, and so does the heat transfer. The heat transfer depends on the size of the gap between the pedestal and the wafer-heat transfer is higher where the gap is smaller.

When the wafer is warped, in a concave, convex, or potato-chip shape, the gap between the wafer and the pedestal varies. The heat transfer then is uneven. Clamping the wafer to the pedestal reduces the variation across the gap and allows the pedestal heater to transfer heat uniformly, but clamping can generate particles. Thermal expansion while the wafer is clamped can damage the wafer; therefore, wafer clamping over a wide temperature range is only possible for limited applications where backside wafer damage due to scratching is not critical. In most applications, wafer clamping may help to control wafer uniformity over a small range of wafer temperature change where thermal expansion or contraction is small.

Pedestal heaters are dependent on the presence of a conduction medium to conduct the heat between the pedestal and the wafer. Helium, nitrogen, argon, or a mixture of these are typically used as conducting gases. Because the heat transfer depends on the conducting gas, the gas flow may be modulated to control the wafer temperature. At pressures above about 2-100 torr, usually about 10 torr, the gas is thermally conductive. At lower pressures, the gas is a poor thermal conductor. Therefore, at very low pressures, the pedestal heater must be maintained at a substantially higher temperature (at least 50-100° C. higher) than the desired wafer temperature to maintain sufficient heat transfer to achieve desired wafer temperature. High temperature pedestals require costly engineering solutions, such as the use of ceramics that are brittle and prone to thermal shock cracking.

At such high temperatures, the wafer reflection of pedestal emission interferes with temperature measurement. Because the wafer temperature is often measured by a pyrometer connected to an optical fiber typically mounted right under the wafer, the radiation from the wafer and the radiation from the pedestal reflected by the wafer are both measured. In order to accurately measure the wafer temperature, the wafer may have to be decoupled from the pedestal, interrupting heat transfer and complicating wafer handling.

Process

This invention synergistically combines the use of lamps and a pedestal heater to rapidly heat a wafer while improving the uniformity achievable with each individual approach, thus solving wafer temperature measurement and wafer temperature control problems. The inventive method uniformly heats the wafer to set point considerably faster and without overshoot.

FIG. 1 shows a generic process flow in accordance with this invention. A substrate is provided to a substrate support 101. This substrate support may be in a load lock, or a process chamber. Although the invention has particular advantages when applied to a load lock, it is not so limited. This generic process flow is independent of pressure changes during wafer heating. Process flows of specific situations are discussed further below.

The substrate is clamped electrostatically to the substrate support 103. Alternatively, the substrate may be held to the substrate support by a physical clamp or clamps, or the substrate may just sit on the substrate support. An electrostatic chuck can maintain a small gap of 10-2000 microns and is less likely to cause particles. However, using an electrostatic chuck increases costs, and clamping during the entire wafer heating would cause damage to the wafer as it expands.

A gas is provided to the gap between the substrate support and the substrate 105. The gas may be already present in the load lock when the substrate is provided or be added after the substrate is provided. This gas conducts heat from the substrate support to the substrate, and may be an inert gas, such as helium, nitrogen, argon, or a mixture of these. In some cases, the gas may be provided to the back side of the substrate via gas injection inlets in the substrate support.

The substrate is first heated with a resistive heat source 107. Most often the resistive heat source is incorporated in the substrate support, or the pedestal. A resistive heater may be embedded in the substrate support and maintain the substrate support at a certain temperature. Designs that involve several zones of electrical coils are known in the art. It should be noted that the use of a resistive heat source in the description of this invention is meant to differentiate from the use of radiant heat source, even though a resistive heat source can emit blackbody radiation and a radiant quartz-halogen lamp can produce heat from, for example, its hot quartz envelope. Other ways of maintaining the substrate support temperature at a temperature above that of the substrate when initially provided may be possible and be used as an alternative to the resistive heat source, in accordance with the invention. One such way is to circulate a heating/cooling fluid within the pedestal.

If the substrate is cooler than the pedestal, the pedestal will transmit heat to raise the substrate temperature. If the substrate is warmer than the pedestal, the pedestal will take heat away and lower the substrate temperature. As discussed above, the temperature gradient, the size of the gap, and the gas in the gap will determine the amount and direction of the heat transfer between the pedestal and the wafer.

Next the substrate is heated with a radiant heat source 109. The radiant heat source may be applied at the same time as the pedestal heater. The heating from the pedestal cannot be changed quickly because the pedestal is, by design, a much larger thermal mass than the wafer. However, the radiant heat source, preferably infrared lamps, may be changed quickly. The heat may be applied by turning on the lamps and stopped by turning the lamps off. The heat may also be adjusted by changing the amount of power applied to the lamps and/or changing the orientation of reflectors and mirrors associated with the lamps. Depending on the type of lamps used, excessive cycling should be avoided because it may shorten the life of the lamps. After the heating steps are completed, the substrate is removed from the chamber 111.

FIG. 1 shows the generic process flow in accordance with the invention. In practice, the sequence of the process steps is timed to take advantage of the efficiencies of each heat source.

Wafer Heating in a Reducing Pressure Environment

Figure 2:
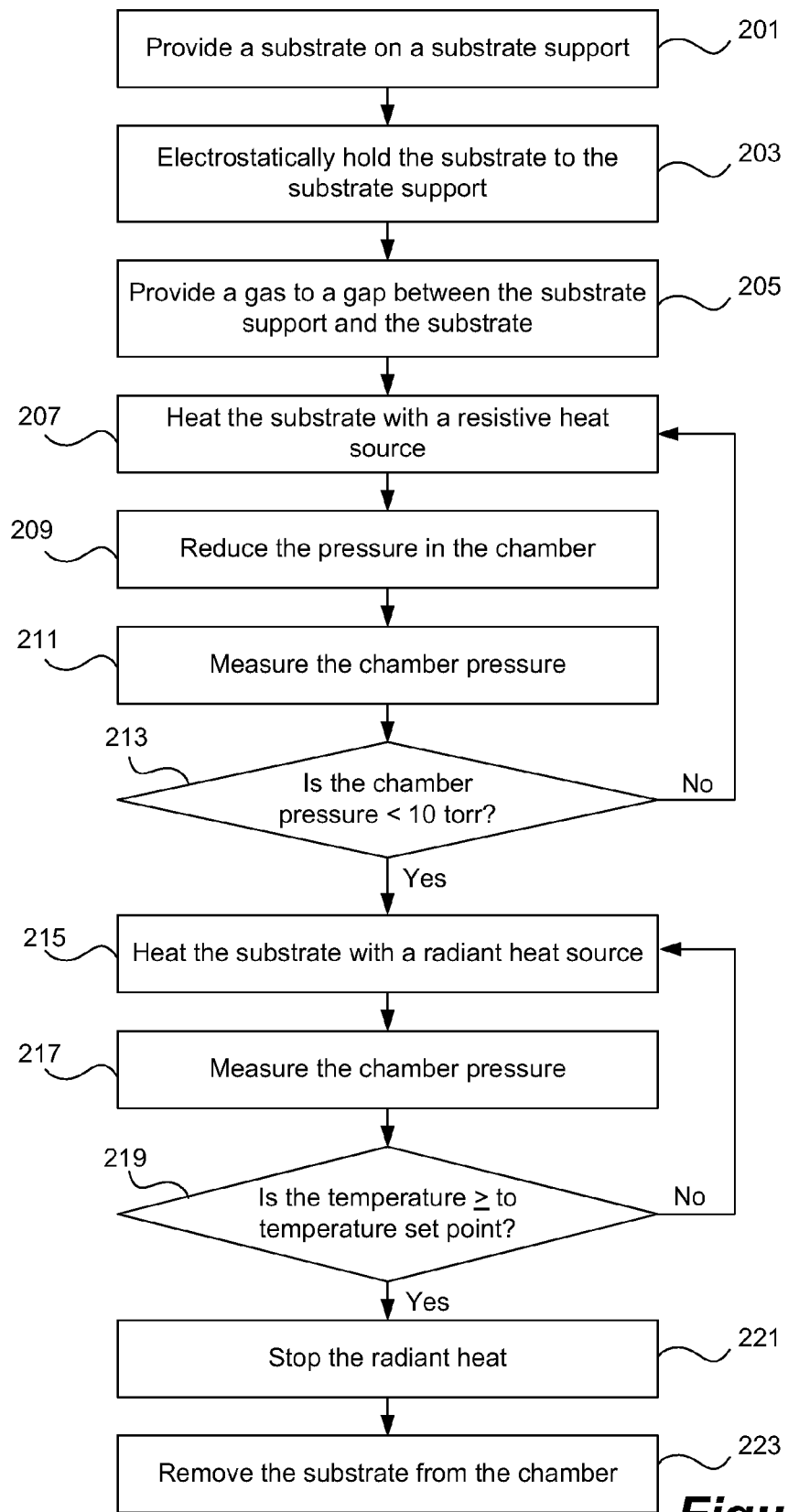
FIG. 2 is a flow chart of a wafer heating method in a changing pressure environment in accordance with the present invention.

FIG. 2 shows the process flow in accordance with one embodiment of the present invention where the pressure drops during the wafer heating. Because the pedestal heat transfer efficiency drops as the pressure is reduced, a majority of the heat transfer will be done via the radiant heat source when the pressure has decreased to a point where the gas in the gap becomes a poor thermal conductor.

To heat wafer in the specific situation where the pressure reduces during heating, first a substrate is provided to a substrate support 201. The substrate may be electrostatically held to the substrate support 203. A gas is provided to a gap between the substrate support and the substrate 205 so as to thermally conduct heat between the substrate and the substrate support. Because the substrate support is held at a constant temperature higher than that of the substrate when it is provided, the substrate is heated with a resistive heat source 207.

The pressure reduces in the chamber or load lock 209. A vacuum source is used to reduce the pressure. A vacuum source may be a vacuum pump dedicated to one load lock or chamber or a vacuum pump shared among more than one chamber or load lock. Alternatively, the reduced pressure could be provided by opening a chamber or antechamber at a reduced pressure to the load lock thereby reducing its pressure. As the pressure reduces, the chamber pressure is monitored 211. At a pressure of about 2-100 torr, preferably about 10 torr, the substrate is heated in greater part by the radiant heat source 213. This may be accomplished by turning on the lamps of the radiant heat source, by turning the reflectors and mirrors, or by increasing the power applied to the lamps. It should be noted that while 10 torr is used as the transition pressure in this example, the transition pressure is dependent on such parameters as the wafer-pedestal gap, and the type and flow (sccm) of thermally conducting gas used.

Heating with the radiant heat source continues until the substrate temperature is equal to or greater than the desired substrate temperature set point. The substrate temperature is measured with a remote thermometer, usually a radiation pyrometer that measures the amount of radiation the substrate emits. When the substrate is much colder than the pedestal, the radiation emitted by the pedestal may interfere with the temperature measurement as it reflects from the backside of the substrate. But when the substrate temperature is equal to or greater than that of the pedestal, the radiation emitted by the substrate can be accurately measured by the pyrometer and converted to a temperature.

One complication of using a radiation pyrometer to measure wafer temperature is that emissivity variations among wafers exist, so that presets are not likely to work universally for all wafer front emissivities. This complication may be resolved by calibrating wafer temperature for each new batch of wafers having the same film properties and entering in emissivities that correct for any differences. Given conducting gas in the gap and time, a wafer will thermally equilibrate with the pedestal. Knowing the temperature of the pedestal would also give the temperature of the wafer, which may then be used to calibrate the pyrometer.

After the substrate reaches the temperature set point, then the radiant heat is stopped 217. The radiant heat source may be stopped by turning off or lowering the power, adjusting the angles of reflectors and mirrors, or a combination of these. The substrate may then be removed from the chamber or load lock 219.

Figure 3:
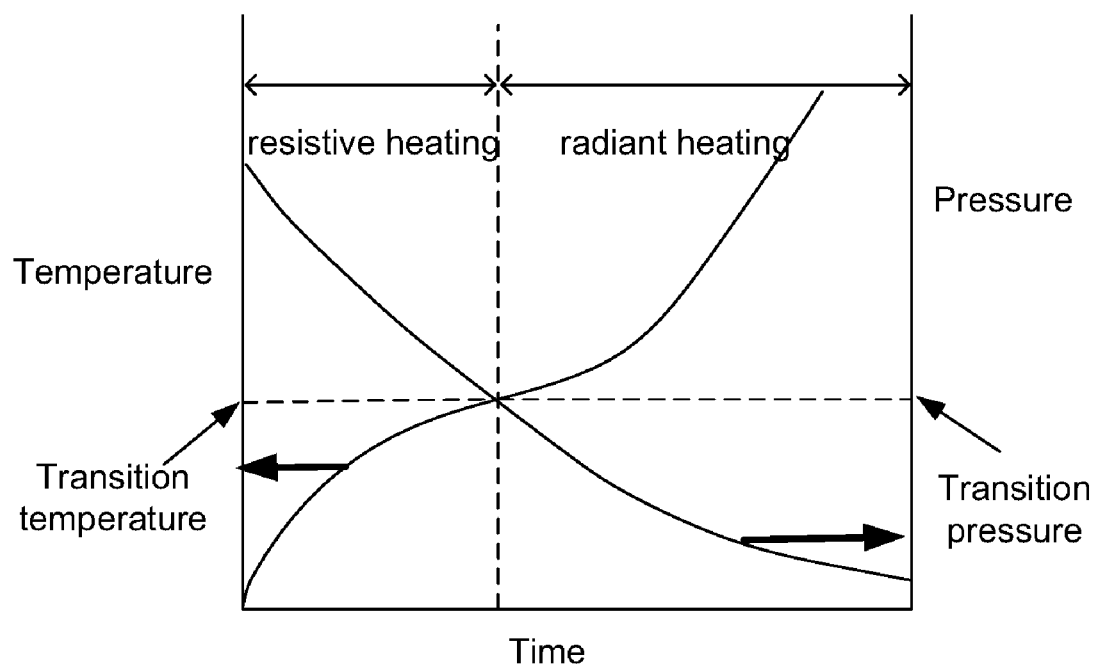
FIG. 3 is a graph of theoretical temperature and pressure over time depicting a wafer heating process in accordance with the present invention.

FIG. 3 illustrates a theoretical temperature and pressure change over time in a changing pressure chamber using the process in FIG. 2. The wafer temperature would rise quickly initially, while the temperature gradient is high between the substrate support and the wafer. The heat transfer from the pedestal to the wafer would slow down as the wafer temperature increases and as the pressure drops. The transition pressure from conductive heating to radiation heating is about 2-100 torr, preferably about 10 torr. At a pressure below about 10 torr, the gas in the gap becomes a poor thermal conductor. The wafer then must be heated in greater part with radiant heat.

At the onset of radiant heating, the wafer may or may not be already at the transition temperature between conductive heating and radiant heating. As discussed above, the transition temperature occurs at about 100-500° C., preferably at about 250° C. Thus, the initial temperature gain attributable to radiant heating may be slow relative to that due to resistive heating.

In some embodiments, to minimize the wafer heating time in a load lock, the transition pressure can be timed to occur at or later than the transition temperature. By delaying the initial depressurization or by pumping down more slowly, this synchronization may be accomplished, as shown on FIG. 3 where the two curves intersect. The loadlock pressure may be maintained above about 10 torr until the wafer begins to absorb significant radiation, then it can be pumped down to base pressure and backfilled with inert gas.

Wafer Heating for Maximum Uniformity

Figure 4:
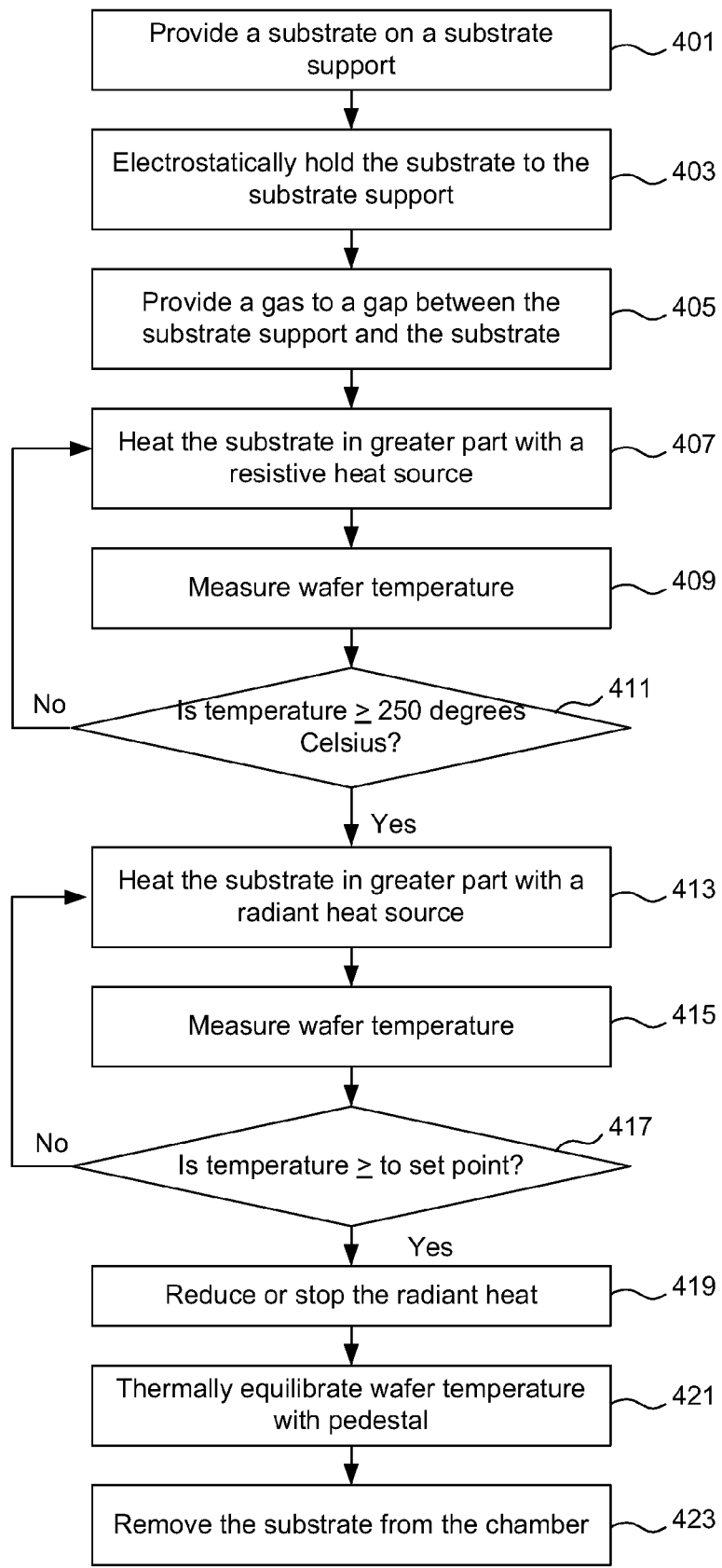
FIG. 4 is a flow chart of a wafer heating method with final pressure above 10 torr in accordance with the present invention.

FIG. 4 shows a flow chart of a wafer heating method with final pressure in the load lock or chamber is above the transition pressure. In this situation, the temperature uniformity across the wafer may be maximized by thermally equilibrating the wafer temperature with the pedestal after the wafer temperature reaches the set point.

To maximize within wafer temperature uniformity in accordance with the invention, first a substrate is provided to a substrate support 401. The substrate may or may not be electrostatically held to the substrate support 403. A gas is provided to a gap between the substrate support and the substrate 405 so as to thermally conduct heat between the substrate and the substrate support. Because the substrate support is held at a constant temperature higher than that of the substrate when it is provided, the substrate is heated in greater part with a resistive heat source initially 407. As the substrate is heated, its temperature is monitored 409. Once the temperature reaches the transition temperature 411, or about 250° C., the heating is switched to radiant heat 413. In some embodiments, the temperature is not monitored; but instead, the heating is switched to radiant heat after some time elapses, which corresponds to the wafer being at the transition temperature. The duration of resistive heating may be modeled or be based on test measurements under similar conditions. This switch may be accomplished by turning on the lamps of the radiant heat source, by turning the reflectors and mirrors, or by increasing the power applied to the lamps. It should be noted that while 250° C. is used as the transition temperature in this example, other transition temperatures may also be selected, as appropriate, in accordance with the parameters provided herein.

The wafer temperature continues to be monitored 415 until a set point is reached 417. At that point the radiant heat is reduced or stopped 419. In some embodiments, the wafer temperature is not monitored. Instead, the wafer is heated with radiation energy for a time, which corresponds to the set point temperature based on test results. The radiant heat source may be stopped by turning off or lowering the power, adjusting the angles of reflectors and mirrors, or a combination of these. The wafer remains on the pedestal to thermally equilibrate with the pedestal 421. Then the wafer is removed 423.

According to this method, the wafer heating rate will slow down when the wafer temperature approaches the pedestal temperature due to reduced temperature gradient from the pedestal to the wafer. Even with the lamps at high power, or high radiant flux to the wafer, wafer temperature could be held closely to the pedestal temperature if heat conductance between the wafer and the pedestal is very high. Because thermally conducting gas is present in the gap between the wafer and the pedestal and the gap is small (10-2000 microns), any excess heat from the lamps will be dissipated to the pedestal. Because the temperature of the pedestal can be kept very uniform, the wafer temperature would also be very uniform once equilibrated.

In one embodiment of this method, a fixed offset of wafer temperature and pedestal temperature may be maintained when wafer temperature is maintained above the pedestal set point, by using radiant heat. When the wafer temperature is higher than the pedestal, the radiation pyrometer can measure the wafer temperature very accurately.

Note that this method only requires that thermally conducting gas be present in the gap in the final stages of wafer heating. The load lock or chamber need not be above the transition pressure during the entire wafer heating process. Because pump down and gas injection may be performed in a few seconds, it is possible to pump out the ambient gas during the beginning of radiant heating and inject thermally conducting gas before the thermal equilibration step.

Figure 5:
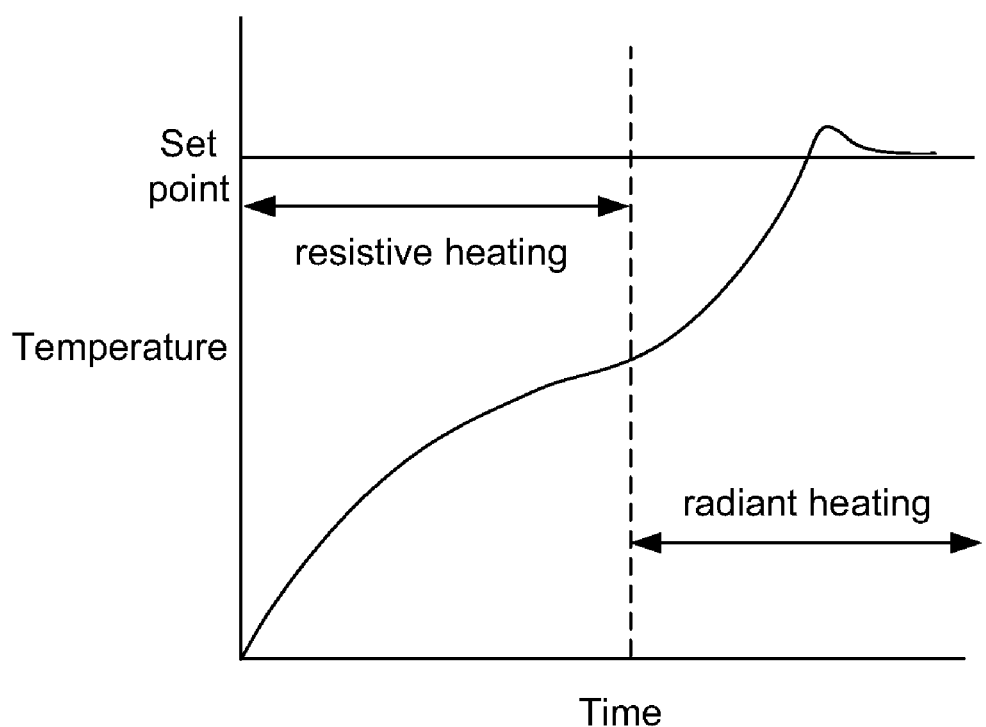
FIG. 5 is a graph of theoretical temperature over time depicting a wafer heating process in accordance with the present invention.

FIG. 5 provides a representative plot of temperature change over time in a using the process in FIG. 4. The wafer temperature rises quickly initially, while the temperature gradient is high between the substrate support and the wafer. The heat transfer from the pedestal to the wafer slows down as the wafer temperature increases and as the pressure drops. The transition temperature from conductive heating to radiation heating is about 250-500° C., preferably about 250° C. At a temperature above 250° C., the temperature gradient is small and heat transfer becomes slow. The wafer then is heated in greater part with radiant heat.

At higher wafer temperatures, radiant heating can quickly heat up a wafer, but the pyrometer cannot accurately measure the wafer temperature until the wafer temperature is at or above that of the pedestal. Therefore, some overshooting the wafer temperature set point is possible. But because the radiant heat can be reduced or turned off very quickly, the overshoot should not exceed the set point by more than an acceptable amount of about 5° C., preferably 1° C. After the radiant heat is reduced, the wafer will quickly equilibrate with the pedestal and become uniform. By keeping the pedestal at the same temperature between wafers, wafer-to-wafer uniformity can also be maximized.

Apparatus

Figure 6:
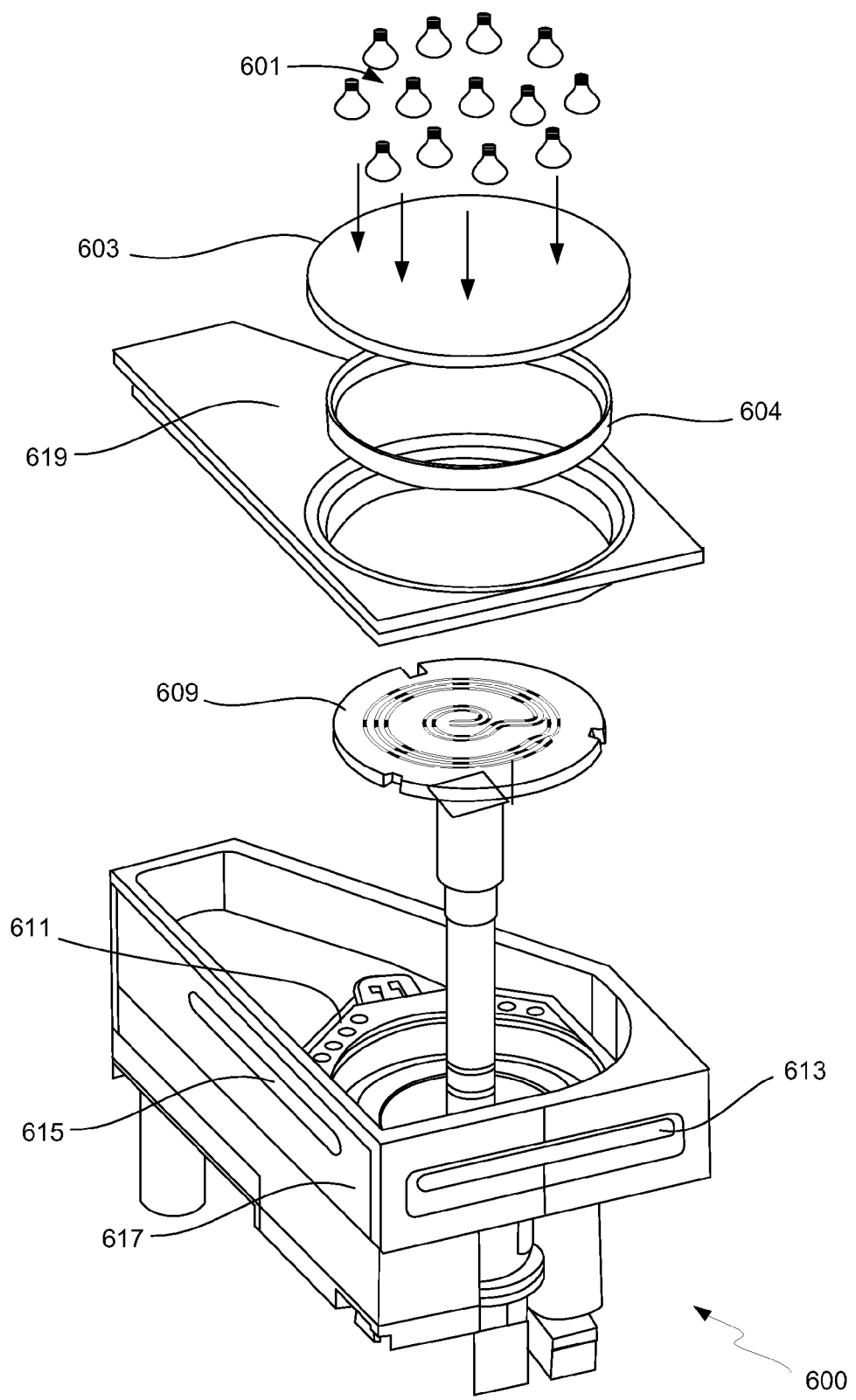
FIG. 6 is an assembly drawing of a load lock in accordance with the present invention.

FIG. 6 shows an assembly drawing of a load lock in accordance with the present invention. The load lock base 617 supports the wafer pedestal 609, which is heated with a resistive heater and may be cooled with a thermal fluid. The load lock base 617 has two openings for wafer transfer, the transfer port 613, and the atmospheric port 615. The transfer port 613 opens to either a processing chamber or a transfer chamber that is coupled to one or more processing chambers. The atmospheric port 615 opens to the atmospheric robot, which moves wafers to and from the loading station or FOUP.

Inside the load lock is the edge grip end effecter 611, which is a wafer handler capable of moving the wafer from the load lock into a processing chamber through the transfer port 613. Not all load locks have an edge grip end effecter 611; a different kind of wafer handler may be used; or in some cases, no wafer handler would be in the load lock. Transfers from the load lock into the next module would then be effected through a wafer handler that is a part of the next module.

The load lock lid 619 sits on top of the load lock base 617, and has an opening on top where a thermal isolation ring 604 and a window 603 composed of an appropriate radiation transmitting material, typically quartz, is mounted. On top of the window 603 is the radiant heat apparatus 601. In some embodiments, the radiant heat apparatus may be located inside the load lock. The thermal isolation ring 604 seals the window 603 against the load lock lid 619 and also prevents the load lock lid 619 from getting hot during radiant heating. Because the window 603 is located very close to the hot radiant heat source 601, the window will become hot through conduction via air, convection, and radiation.

Note that FIG. 6 shows one embodiment of a load lock in accordance with the present invention. One skilled in the art may note that the invention may be practiced with many types of load locks. For example, the radiation source may be inside the load lock and be placed circumferentially about the pedestal to increase the angle of incidence, which may make the radiant heat more effective. The pedestal may have z-axis motion. The load lock may also be shaped differently from FIG. 6.

The radiant heat source array 601 may include an array of individual radiant heat sources such as coarse halogen lamps or other infrared radiation sources. Various optical elements, such as reflectors, may be required to direct the radiation toward portions of the substrate. Methods for directing the light at different portions of the substrate at different times may be required as well. A scanning mechanism may be used for this purpose. A window 603 made of quartz, sapphire, or other suitable material is positioned between radiant heat source array 601 and wafer to provide vacuum isolation. Filters can also be used to remove unwanted spectral components from particular sources to "tune" the sources.

The radiant heat source array 601 may be comprised of one or more types of radiant heat sources, for example an array of three types of sources, each type providing infrared radiation with a different wavelength distribution. The radiant heat sources are electrically connected to each other and controlled by a control system, which controls when each of the various radiant heat sources is illuminated. Control system is typically, but not limited to, a computer processing system such as a PC or workstation. Of course, any number and types of individual light sources in any suitable configuration can be used.

Note that the light source array and control configuration of FIG. 6 is only an example of a suitable configuration. In general, it is preferable that the lamps are arranged to provide uniform radiant heat to the wafer. For example, other suitable lamp arrangements can include circular lamps concentrically arranged or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, and/or mirrors, can be controlled to direct light from different sources to the substrate at different times.

The radiant energy can be directly controlled by the type of radiant heat source and by the power applied to the radiant heat source or array of radiant heat sources. Factors influencing the energy applied to the wafer include, for example, the number of radiant heat sources (e.g., in an array of radiant heat sources) and the radiant heat source types (e.g., lamp type). Other methods of controlling the amount of radiant energy applied to the wafer include using filters that can block portions of light from reaching the wafer sample. As with the direction of radiant energy, the intensity of radiant energy at the wafer can be modulated using various optical components such as mirrors, lenses, diffusers and filters. The spectral distribution of individual sources can be controlled by the choice of sources as well as the use of filters that tailor the spectral distribution. Examples of UV radiation apparatus suitable for implementing the present invention are also described in commonly assigned co-pending application Ser. Nos. 11/115,576 filed Apr. 26, 2005, 10/800,377 filed Mar. 11, 2004 and 10/972,084 filed Oct. 22, 2004, incorporated by reference herein.

Figure 7:
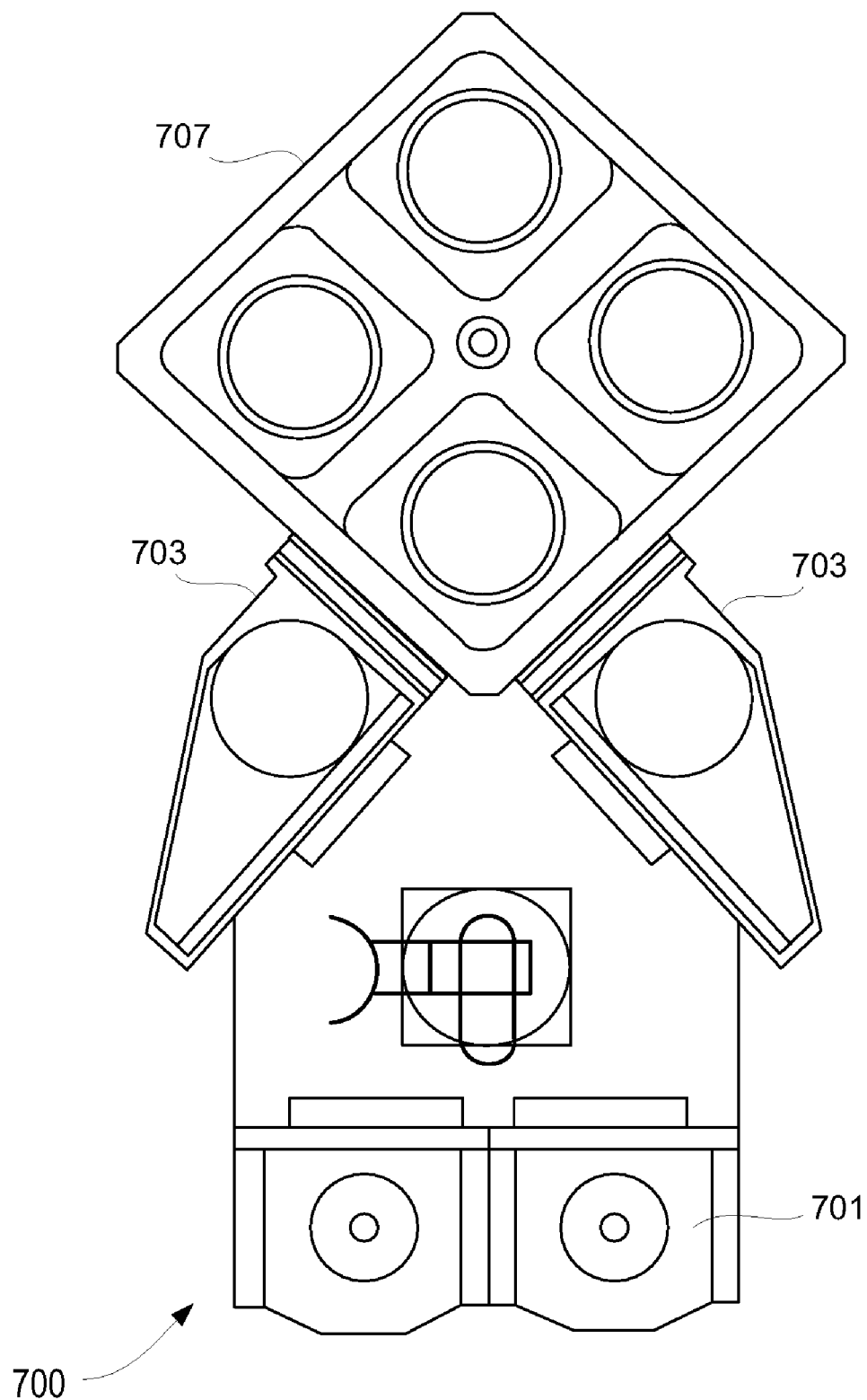
FIG. 7 is a schematic of a semiconductor processing apparatus in accordance with the present invention.

FIG. 7 shows a semiconductor processing tool 700 in accordance with the present invention. In FIG. 7, one multi-station reactor 707 is shown coupled to two load locks 703. The rapid wafer heating may be performed in either one of the load locks. Both load locks 703 are connected to a wafer handler that moves the wafer from load station 701. However, the invention is not limited to a semiconductor processing tool of this configuration. For example, one or more multi-station reactors may be coupled to a transfer chamber that is coupled to one or more load locks. Suitable semiconductor processing tools, for example, include the modified Novellus Sequel, Inova, Altus, Speed, and Vector systems, produced by Novellus Systems of San Jose, Calif. The reactors need not be multi-station reactors, but may be single station reactors. Similarly, the loadlocks may be multiple wafer loadlocks fitted with multiple wafer heating stations, for example a dual wafer loadlock fitted with two wafer heating stations.

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. A load lock for substantially uniform and rapid heating of a substrate in a pressure changing environment, the load lock comprising:
    a load lock housing comprising a window made from a radiation transmitting material, the load lock housing is configured to be attached to a vacuum source to reduce a pressure inside the load lock housing;
    a radiant heat source positioned outside of the load lock housing and arranged to transmit radiation through the window and to the substrate while the pressure inside the load lock housing is being reduced;
    a substrate support for supporting the substrate; and
    a resistive heat source arranged in the substrate support.

2. The load lock of claim 1, wherein the radiant heat source has adjustable power output.

3. The load lock of claim 1, wherein the radiant heat source comprises one or more heating lamps.

4. The load lock of claim 1, wherein the resistive heat source is configured to maintain the substrate support at a substantially constant temperature.

5. The load lock of claim 1, wherein the substrate support further comprises a substrate holding mechanism for holding the substrate in place.

6. The load lock of claim 1, wherein the load lock further comprises one or more gas injection ports.

7. The load lock of claim 1, wherein the radiation transmitting material comprises one or more materials selected from the group consisting of quartz and sapphire.

8. The load lock of claim 1, further comprising a reflector positioned in between the radiant heat source and the substrate support, the reflector is configured to redistribute radiation to a surface of the substrate.

9. The load lock of claim 1, further comprising a spectral filter positioned in between the radiant heat source and the substrate support, the spectral filter is configured to block one or more selected spectral components emitted by the radiant heat source.

10. The load lock of claim 1, wherein the radiant heat source comprises two or more heat sources, each heat source is configured to provide infrared radiation at different wavelengths.

11. The load lock of claim 2, wherein the adjustable power output is controlled based on a temperature of the substrate.

12. The load lock of claim 3, wherein the one or more heating lamps comprises an array of heating lamps configured to provide a substantially uniform heat flux to an entire surface of the substrate.

13. The load lock of claim 5, wherein the substrate holding mechanism is an electrostatic chuck.

14. The load lock of claim 10, wherein each of the two or more heat sources is controlled independently.

15. A method of heating a substrate in a load lock, the method comprising:

providing the substrate on a substrate support positioned in a load lock housing, the load lock housing comprising a window made from a radiation transmitting material;

heating the substrate with a radiant heat source through the window of the load lock housing, the radiant heat source positioned outside of the load lock housing, wherein a pressure in the load lock housing is reduced during heating; and heating the substrate with a resistive heat source arranged in the substrate support.

16. The method of claim 15, wherein the substrate is heated in greater part by the resistive heat source until the substrate reaches a temperature of about 250° C.

17. The method of claim 15, wherein the substrate is heated in greater part by the radiant source between about 250° C. and a desired temperature set point of the substrate.

18. The method of claim 15, wherein the substrate is heated in greater part by the resistive heat source until the load lock housing reaches a pressure of less than about 10 Torr.

* * * * *